United States Patent [19]

Choi

[11] Patent Number: 5,818,258
[45] Date of Patent: Oct. 6, 1998

[54] INTEGRATED CIRCUIT OUTPUT BUFFERS HAVING DURATION SENSITIVE OUTPUT VOLTAGE, AND RELATED BUFFERING METHODS

[75] Inventor: Hoon Choi, Kyungki-do, Rep. of Korea

[73] Assignee: Samsung Electronics Co., Ltd., Suwon, Rep. of Korea

[21] Appl. No.: 707,903

[22] Filed: Sep. 12, 1996

[30] Foreign Application Priority Data

Sep. 14, 1995 [KR] Rep. of Korea .................. 1995 30109

[51] Int. Cl.$^6$ ................. H03K 19/0185; H03K 19/0948
[52] U.S. Cl. .............................. 326/83; 326/27; 326/68; 326/88
[58] Field of Search ........................... 326/21, 31, 33–34, 326/63, 68, 80–81, 88, 89, 83, 27

[56] References Cited

U.S. PATENT DOCUMENTS

| | | | |
|---|---|---|---|
| 4,656,373 | 4/1987 | Plus | 326/81 |
| 4,801,826 | 1/1989 | Cornelissen | 326/88 X |
| 4,833,350 | 5/1989 | Frisch | 326/81 X |
| 5,056,062 | 10/1991 | Kuwabara et al. | 326/88 X |
| 5,204,557 | 4/1993 | Nguyen | 326/17 X |
| 5,406,140 | 4/1995 | Wert et al. | 326/68 |
| 5,418,474 | 5/1995 | Davis et al. | 326/81 X |
| 5,451,889 | 9/1995 | Heim et al. | 326/81 |
| 5,502,406 | 3/1996 | Traynor et al. | 326/68 |

*Primary Examiner*—Jon Santamauro
*Attorney, Agent, or Firm*—Myers Bigel Sibley & Sajovec

[57] ABSTRACT

Integrated circuit output buffers and buffering methods are responsive to the input logic signal frequency to produce higher output voltages for lower frequency logic signals and lower output voltages for higher frequency logic signals. Stated differently, the output level is not raised when the data signal is provided at high speed so that power consumption and noise malfunctions may be reduced. An integrated circuit output buffer includes a driver circuit which is responsive to an input logic signal which is at a first input logic value, to drive an output terminal to a first output logic value. The driver circuit is responsive to the input logic signal at a second logic value which is logically complementary to the first input logic value, to drive the output terminal to a second output logic value at a first voltage level, where the second output logic value is logically complementary to the first output logic value. The integrated circuit buffer also includes a time dependent driver boosting circuit, which is responsive to the input logic signal being at the second input logic value for a predetermined time, to boost the driver circuit to drive the output terminal to the second logic value at a second voltage level which is of greater magnitude than the first voltage level.

17 Claims, 5 Drawing Sheets

INTEGRATED CIRCUIT OUTPUT BUFFERS HAVING DURATION SENSITIVE OUTPUT VOLTAGE, AND RELATED BUFFERING METHODS

FIELD OF THE INVENTION

This invention relates to integrated circuit devices such as semiconductor memory devices, and more particularly to output buffering circuits and methods for integrated circuit devices such as semiconductor memory devices.

BACKGROUND OF THE INVENTION

As the integration density of integrated circuit devices such as semiconductor memory devices continues to increase, the active devices such as transistors have become smaller. These smaller transistors generally can operate at higher speeds and at lower voltages. For example, operational voltages of Dynamic Random Access Memory (DRAM) devices have decreased from about 5 volts to about 3.3 volts as the integration density of these devices continues to increase. A further drop in operating voltage may be expected.

This decrease in operating voltage may produce problems for the output buffers which are used in the integrated circuit devices. As is well known to those having skill in the art, an output buffer, also referred to as a data output buffer, is responsive to an input logic signal to drive an output node. Although output buffers are often referred to as data output buffers, it will be recognized that the input logic signal may include data, program instructions, control signals or other binary signals.

When an integrated circuit memory device operates with a power supply voltage of 5 volts, a logic "1" is generally over about 2.4 volts and a logic "0" is generally less than 0.4 volts. However, as high density integrated circuit devices have reduced their power supply voltage level from 5 volts to 3.3 volts, the logic voltages have also changed. In particular, for a high speed data output signal, also referred to herein as an Alternating Current (AC) signal, data output level is generally over about 2.0 volts for a logic "1" and generally below about 0.8 volts for a logic "0". On the other hand, for a low speed data output signal, also referred to herein as a Direct Current (DC) signal, the data output level is generally above about 2.4 volts for a logic "1" and generally below about 0.4 volts for a logic "0", similar to the voltage levels for 5 volt power supply devices.

Figure 1:
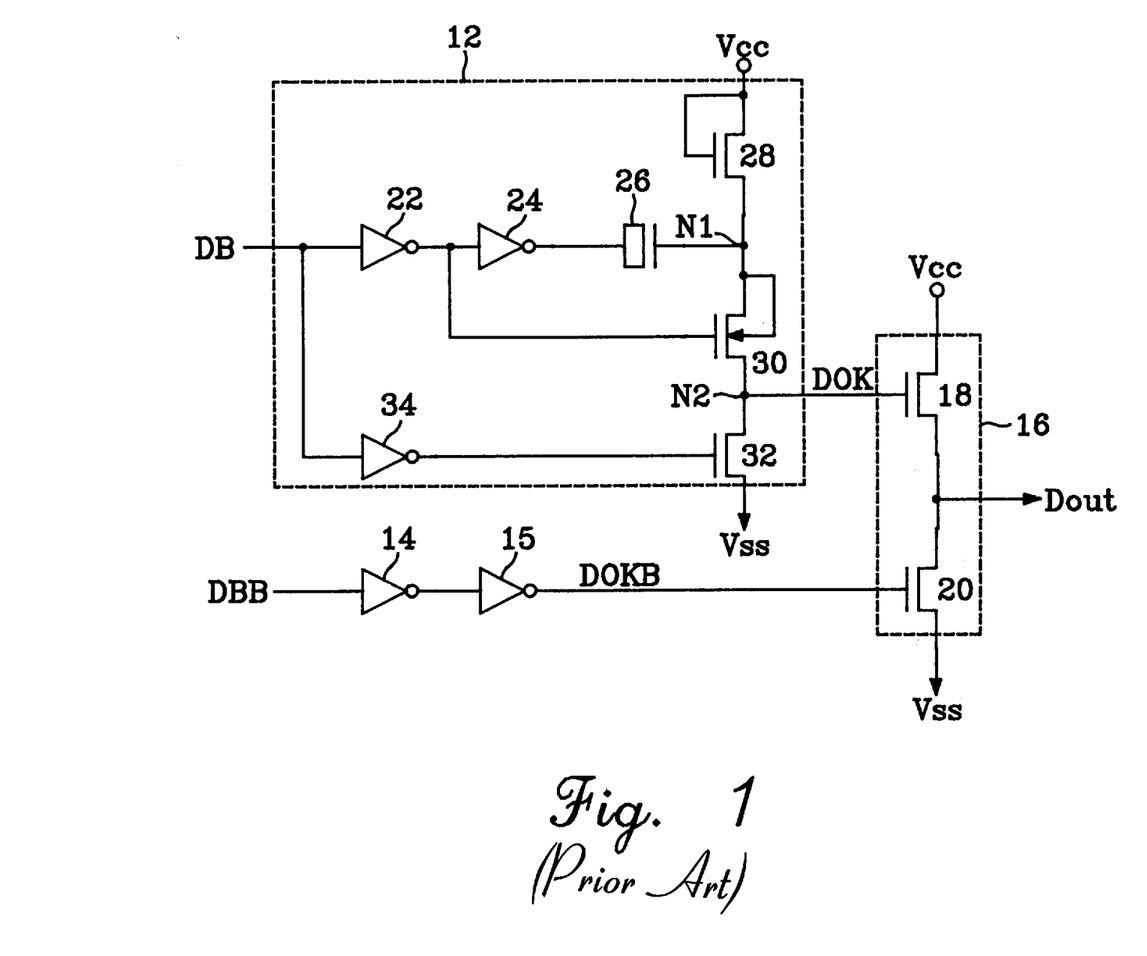
FIG. 1 is a circuit diagram of a conventional data output buffer.

FIG. 1 is a circuit diagram illustrating a data output buffer of a conventional semiconductor memory device. In the data output buffer, a boosting circuit 12 boosts a power supply voltage Vcc and provides the boosted voltage as a pull-up control signal DOK in response to a first logic level, i.e., a logic "high" level on a first data line DB. Inverters 14 and 15 generate a pull-down control signal DOKB when the second data line DBB is at the first logic level. It will be understood that the DB signal and DBB (DB bar) signals are logically complementary to one another.

An output data driver 16, which is connected between the power supply voltage Vcc and a reference voltage Vss (generally ground voltage), includes a pull-up transistor 18 and a pull-down transistor 20. Output driver 16 buffers the data on the first data line DB to an output terminal Dout in response to the pull-up control signal DOK and buffers the data on the second data line DBB to the output terminal Dout in response to the pull-down control signal DOKB.

Figure 2:
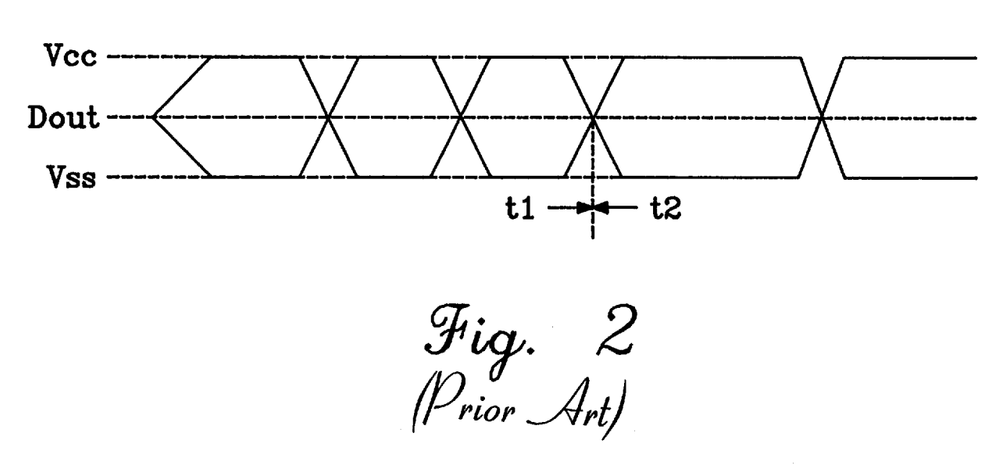
FIG. 2 graphically illustrates output waveforms for the data output buffer in FIG. 1.

FIG. 2 graphically illustrates output waveforms for the data output buffer of FIG. 1. When the circuit of FIG. 1 is active, an NMOS transistor 28, which is diode-connected between the power supply voltage and an internal node N1, is turned on. Consequently, one electrode of MOS capacitor 26 is precharged to a voltage level of Vcc-Vtn, where Vtn is a threshold voltage of the NMOS transistor 28. When data having logic "high" and "low" levels are respectively input to the first and second data line pair DB/DBB, the inverters 22 and 34 invert the signal on the first data line DB and supply the inverted signal to the input node of the inverter 24 and the gate of an NMOS transistor 32, respectively. The logic "low" signal which is inverted by the inverter 22, is supplied to the gate of a PMOS transistor 30 whose source is coupled to the internal node N1, and is also supplied to the other electrode of the MOS capacitor 26 through the inverter 24.

Thus, the MOS capacitor 26 boosts the voltage of the internal node N1 to about 2Vcc-Vtn, and the NMOS transistor 32 whose drain is coupled to the drain of the PMOS transistor 30 and whose source is coupled to the reference voltage Vss, is turned off by the logic "low" level of signal output from the inverter 34. The boosted voltage 2Vcc-Vtn of the internal node N1 is supplied as the pull-up control signal DOK, via the connection node N2, to the data output driver 16, through the channel between the source-drain of the PMOS transistor 30.

As already described, the data output driver 16 includes N-channel pull-up transistor 18 and pull-down transistor 20. The drain of pull-up transistor 18 is coupled to the power supply voltage Vcc, the source is coupled to the output terminal Dout, and the gate is coupled to the pull-up control signal DOK. The source of pull-down transistor 20 is coupled to the reference voltage Vss, the drain is coupled to the output terminal Dout, and the gate is coupled to the pull-down control signal DOKB. The pull-down control signal DOKB is a signal which is output from the inverters 14 and 15, which drive the output of the second data line DBB.

When the data at the first logic level is input to the first data line DB, the pull-up transistor 18 within the data output driver 16 is turned on by the boosted voltage 2Vcc-Vtn which is supplied by the boosting circuit 12, and the power supply voltage Vcc level is driven to the output terminal Dout, thereby producing the logic data "1". On the other hand, when the data at the first logic level is input to the second data line DBB, the pull-up control signal DOK is at the reference voltage Vss and the pull-down control signal DOKB is at the power supply voltage level Vcc. Then, the pull-up transistor 18 is turned off, and the pull-down transistor 20 is turned on, so that the output terminal Dout level pulls down to the reference voltage Vss level.

Therefore, the output waveform of the data output buffer of FIG. 1 is as illustrated in FIG. 2. Thus, a conventional data output buffer boosts the voltage on the gate of the pull-up transistor 18 to provide an output at logic "high" level, to satisfy with the above-described data output levels for a power supply voltage Vcc of 3.3 volts.

Unfortunately, such a data output buffer circuit may also create problems. First, for an AC signal, where the data output is accessed at a high speed, a data output level of about 2.0 volts may be sufficient, but the actual data output voltage level is about 2.4 volts. This may cause the data output level to be excessive for high speed access of data, and also may cause generation of noise within the chip upon output of the logic data "0". Second, since the output of the boosting circuit is applied to the gate of the pull-up transistor within the data output driver, power consumption may increase upon the high speed access of data. The layout area of the MOS capacitors of the boosting circuit may accordingly increase, which may impact the device density in the integrated circuit. Finally, data transitions may occur during a very short time period for a high speed memory, due to the limits of the physical reaction of MOS capacitor formed by using a CMOS process. This may cause improper operation of the boosting circuit. The desired logic data may not be output.

SUMMARY OF THE INVENTION

It is therefore an object of the present invention to provide improved integrated circuit output buffers and buffering methods.

It is another object of the present invention to provide integrated circuit output buffers and buffering methods which can produce output logic signals at low noise.

These and other objects are provided, according to the present invention, by integrated circuit output buffers and buffering methods which are responsive to the input logic signal frequency to produce higher output voltages for lower frequency logic signals and lower output voltages for higher frequency logic signals. Stated differently, the output level is not raised when the data signal is provided at high speed, so that power consumption may be reduced and noise malfunctions may be reduced.

In particular, driver circuits according to the invention are responsive to an input logic signal having an input logic signal frequency, to produce first and second output voltages corresponding to first and second output logic values at an output terminal thereof in response to the input logic signal having a first input logic signal frequency. The driver circuit produces the first output voltage and a third output voltage corresponding to the first and second output logic values at the output terminal, in response to the input logic signal having a second input logic signal frequency which is lower than the first input logic signal frequency, wherein the third voltage is of greater magnitude than the first voltage.

An embodiment of the present invention includes a driver circuit which is responsive to an input logic signal which is at a first input logic value, to drive an output terminal to a first output logic value. The driver circuit is responsive to the input logic signal being at a second logic value which is logically complementary to the first input logic value, to drive the output terminal to a second output logic value at a first voltage level, where the second output logic value is logically complementary to the first output logic value. The integrated circuit buffer also includes a time dependent driver boosting circuit, which is responsive to the input logic signal being at the second input logic value for a predetermined time, to boost the driver circuit to drive the output terminal to the second logic value at a second voltage level which is of greater magnitude than the first voltage level.

Driver circuits according to the present invention may include a pull-up circuit which pulls up the output terminal to the second logic value in response to a pull-up control signal which is applied thereto, and a pull-down circuit which pulls down the output terminal to the first logic value in response to a pull-down control circuit which is applied thereto. In this driver circuit arrangement, the time dependent driver boosting circuit preferably comprises a pull-up control circuit which produces the pull-up control signal at a first control signal level in response to the input logic signal being at the second input logic value for less than a predetermined time, and which produces the pull-up control signal at a second control signal level which is of greater magnitude than the first control signal level, in response to the input logic signal being at the second input logic value for the predetermined time. A pull-down control circuit is also included, which produces a pull-down control signal in response to the input logic signal being at the first input logic value and which applies the pull-down control signal to the pull-down circuit.

In an embodiment, the pull-up circuit includes a pull-up transistor having a controlling electrode (for example a gate) and a pair of controlled electrodes (for example source and drain). The controlled electrodes are connected between a first reference voltage (such as a power supply voltage Vcc) and the output terminal. The pull-up signal is provided to the controlling electrode. The pull-down circuit includes a pull-down transistor having a controlling electrode and a pair of controlled electrodes. The controlled electrodes are connected between a second reference voltage (for example ground voltage Vss) and the output terminal. The pull-down signal is provided to the controlling electrode.

In the above described embodiment, the pull-up circuit preferably includes a driver which is responsive to the input logic signal being at the second input logic value, to generate the pull-up control signal at the first pull-up control signal level. A delay detector detects that the second input logic value has been maintained for the predetermined time. A booster is responsive to the delay detector to generate the pull-up control signal at the second pull-up control signal level, in response to the second input logic value being maintained for the predetermined time. The pull-up circuit also preferably comprises a level shifter which is connected between the delay detector and the booster and which is connected to the driver. The level shifter generates a level shift signal in response to the second input logic value being maintained for the predetermined time. The booster is responsive to the level shift signal to generate the pull-up control signal at the second pull-up control signal level. The driver is responsive to the level shift signal to deactivate the pull-up control signal at the first pull-up control signal level.

Preferably, the first pull-up control signal level is equal to the first reference voltage, for example the power supply voltage Vcc. The first voltage level is less than the first reference voltage in magnitude. The second pull-up control signal level is preferably greater in magnitude than the first reference voltage and the second voltage level is equal to the first reference voltage. Thus, in response to a high frequency signal, the data output terminal may be driven between ground voltage and a voltage which is less than the power supply voltage. In response to a low frequency input signal, the data output terminal may be driven between ground voltage and the power supply voltage.

Accordingly, integrated circuit output buffers and buffering methods according to the invention output a first logic level of data when data is accessed at a low speed, and output a second logic level of data higher than the first logic level of data when data is accessed at a high speed, so that power consumption may be reduced and stabilized data may be produced. In particular, the voltage level of the pull-up control signal of the data output driver is varied in accordance with the time variation, when logic data "1" is output to the data output terminal of the data output driver, and thus the data levels output to the data output terminal are changed.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
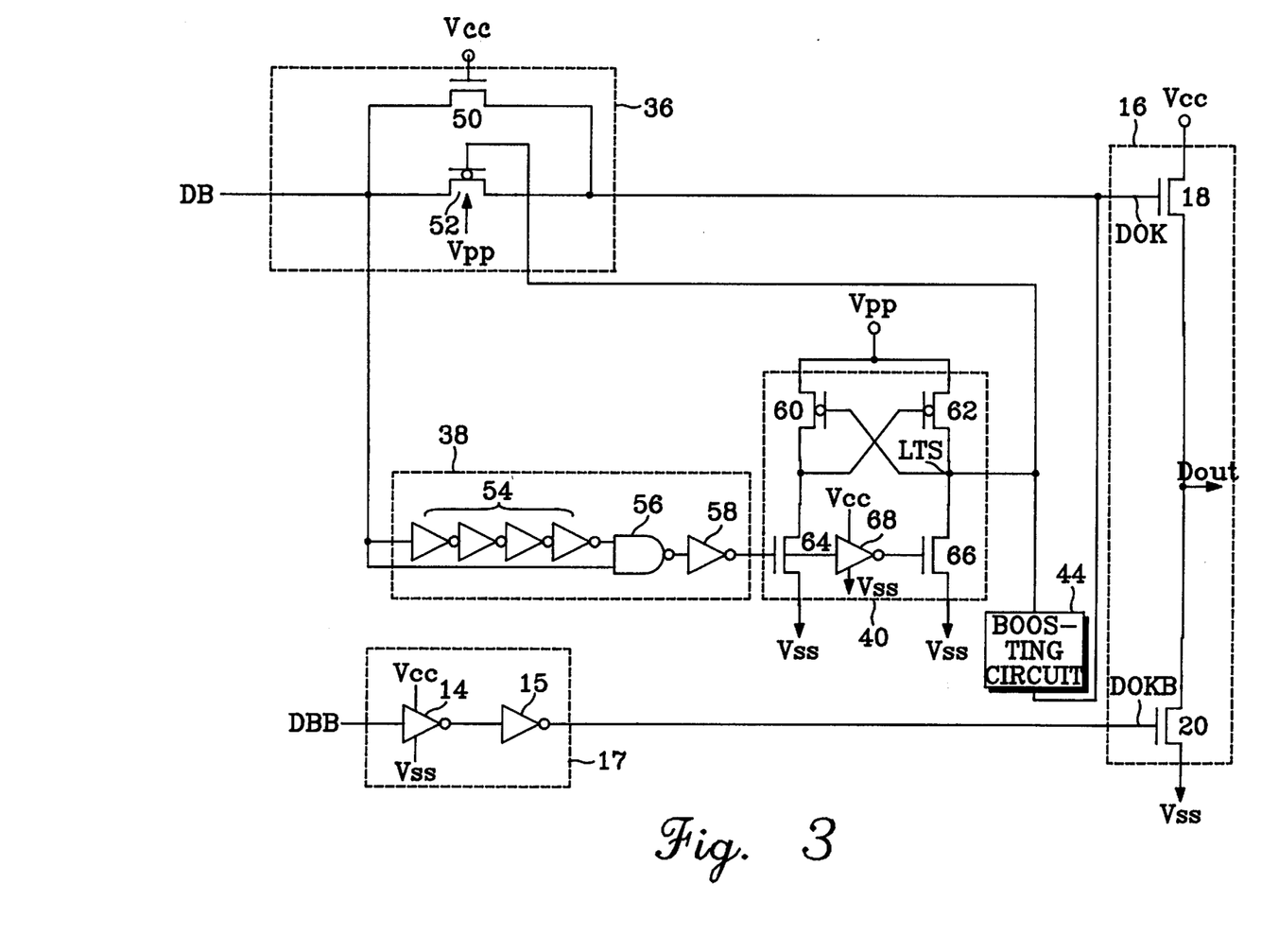
FIG. 3 is a circuit diagram of a data output buffer according to a first embodiment of the present invention.

Referring now to FIG. 3, a first driver 36 generates a first logic level of a pull-up control signal in response to the transition of data on a first data line DB from a first logic level to a second logic level. A delay detector 38 detects a prescribed time duration of a second logic level on the first data line and generates a level shift control signal. A level shifter 40 is triggered by the level shift control signal and generates a level shift signal LTS. A booster 44 boosts a power supply voltage Vcc and generates a second power supply voltage in response to the level shift signal LTS. As already described, reference numeral 16 indicates a data output driver. Reference numeral 17 connected to the second data line DBB, represents a pull-down control signal generator comprised of inverters 14 and 15, which generates a pull-down control signal in response to the first logic level of data on the second data line DBB.

Operation of the circuit of FIG. 3 will now be described. When the power supply voltage Vcc is supplied to the circuit of FIG. 3 and the data on the first data line DB and on the second data line DBB are respectively at the logic "high" and "low" states, a gate node DOK of the pull-up transistor 18 within the data output driver 16 is set to the power supply voltage Vcc level. In particular, when a signal having the logic "high" state is input to the first data line DB and a signal having the logic "low" state is input to the second data line DBB, the signals are respectively input to the first driver 36 and the pull-down control signal generator 17.

At this time, the turned on NMOS transistor 50, the gate of which is connected to the boosting voltage Vpp within the first driver 36, supplies the logic "high" state on the first data line DB to the gate node DOK of the pull-up transistor 18. The pull-down control signal generator 17 supplies the logic "low" state of the second data line DBB to a gate node DOKB of the pull-down transistor 20 through the serially-connected inverters 14 and 15.

Accordingly, the voltage on the gate node DOK of the pull-up transistor 18 is set to the power supply voltage Vcc, and the voltage on the gate node DOKB of the pull-down transistor 20 is set to the reference voltage Vss. The pull-up transistor 18 is thus turned on and the pull-down transistor 20 is turned off. The output terminal Dout of the data output driver 16 is thus at a voltage level "Vcc–Vtn", where the "Vtn" represents the threshold voltage of pull-up transistor 18.

When the data level on the first and second data lines DB/DBB is flipped, the data on the first data line DB changes to the logic "low" level, and the data on the second data line DBB changes to the logic "high" level. As a result, the pull-down transistor 20 is turned on, and the voltage on the gate node DOK of the pull-up transistor 18 is discharged to the first data line DB through the PMOS transistor 52 and the NMOS transistor 50. The voltage on gate node DOK thus changes to ground voltage Vss. Hence, when the data on the first data line DB changes to the logic "low" level, the pull-up transistor 18 is turned off, and the output terminal Dout level falls to ground voltage Vss by the turned on pull-down transistor 20. When the data on the data line pair DB/DBB is again flipped and changed, the above-described operation will be repeated.

After the data logic on the first data line DB changes from the logic "low" level to the logic "high" level, the gate voltage of the PMOS transistor 52 remains in the logic "low" state, until the changed logic level state has a predetermined time duration. The predetermined time duration is set as a gate delay time by an inverter chain 54 within the delay detector 38. When the data on the first data line DB changes from the logic "low" level to the logic "high" level, the PMOS transistor 52 is turned off after passing the delay time by the inverter chain 54, and the pull-up transistor 18 is driven by the first level of the pull-up control signal, i.e., by the full power supply voltage Vcc, transmitted through the PMOS transistor 52 during the delay time by the inverter chain 54. Thus, the data output terminal Dout is driven to the voltage "Vcc–Vtn" level, where the "Vtn" is the threshold voltage of the pull-up transistor 18.

The logic "high" state of data on the first data line DB is also supplied to an input node of a first inverter in the inverter chain 54 within the delay detector 38, and is simultaneously supplied to one input node of the NAND gate 56. The signal input to the inverter is delayed by the inverter chain 54 and is applied to the other input node of the NAND gate 56. When the data on the first data line DB is maintained in a logic "high" state for the predetermined time, the two input nodes of the NAND gate 56 changes to logic "high" state and the output of the NAND gate changes from the logic "high" state to the logic "low" state. If the logic "high" state duration of the data on the first data line DB is shorter than the predetermined delay time duration of the inverter chain 54, and the logic states on the two input nodes of the NAND gate 56 are thus opposite to each other, the output of NAND gate 56 holds the logic "high" state. The output node of the NAND gate 56 is connected to the input node of an inverter 58, and the output node of the inverter 58 is connected to a control terminal of the level shifter 40.

The level shifter 40 includes PMOS transistors 60 and 62, NMOS transistors 64 and 66, and an inverter 68. When the power supply voltage Vcc is applied to the semiconductor chip, the PMOS transistors 60 and 62 respectively are connected to a boosting voltage Vpp from an internal boosting circuit (not shown) at their sources. The drains of the NMOS transistors 64 and 66 are cross-connected to the gates of the PMOS transistors 60 and 62, and are also connected to the drains of the PMOS transistors 60 and 62. The sources of NMOS transistors 64 and 66 are also connected to the reference voltage Vss. The inverter 68 inverts the control signal input to the gate of the NMOS transistor 64 and supplies the inverted signal to the gate of the NMOS transistor 66.

When the signal at logic "low" state is output from the inverter 58 within the delay detector 38, the NMOS transistor 66 and the PMOS transistor 60 are turned on and the level shift signal LTS at the logic "low" state is supplied to the gate of the PMOS transistor 52. On the other hand, if the logic "high" state of data on the first data line DB is maintained during the predetermined time period, and a logic "high" state is thus output from the inverter 58 within the delay detector 38, the NMOS transistor 64 and the PMOS transistor 62 are turned on. The level shift signal LTS having the boosting voltage Vpp level is output to turn off the PMOS transistor 52.

Accordingly, if the logic "high" state time duration of the data on the first data line DB is shorter than the predetermined delay time duration in the delay detector 38, the output LTS of the level shifter 40 is output to the ground voltage Vss and the PMOS transistor 52 is turned on. On the other hand, if the logic "high" state time duration of the data on the first data line DB is longer than the predetermined delay time duration in the delay detector 38, the output LTS of the level shifter 40 is output to the boosting voltage Vpp and the PMOS transistor 52 is turned off, to thereby control the voltage level on the gate node DOK of the pull-up transistor 18.

Figure 5:
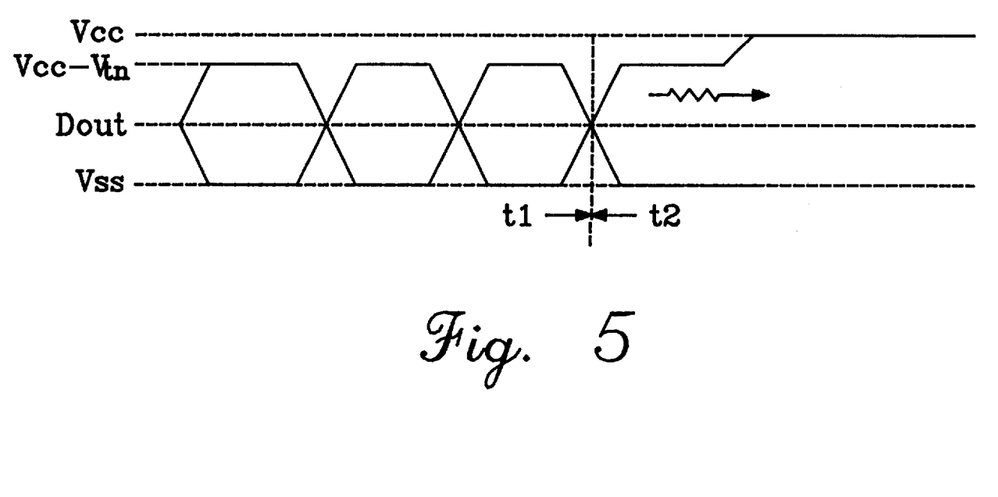
FIG. 5 graphically illustrates output waveforms for the data output buffer in FIG. 3.

When the data on the first data line DB has a shorter time period than the predetermined delay time duration in the delay detector 38, in an AC condition where the data output is accessed at a high speed, the output of the data output driver 16 has the voltage "Vcc−Vtn" level within a period t1 shown in FIG. 5. Alternatively, when the data on the data line pair DB/DBB is input in the DC condition, i.e., when the data access speed from the memory cell is slower than the predetermined delay time in the delay detector 38, the data output driver 16 is driven by a second level of voltage, that is, the boosting voltage Vpp output from the boosting circuit 44.

Thus, when the signal at the logic "high" level is input on the first data line DB and the first level of voltage is supplied to the gate of the pull-up transistor 18, if the signal input to the first data line DB holds the logic "high" state during a predetermined time period, the output of the NAND gate 56 within the delay detector 38 changes to the logic "low" state. When the output of the NAND gate 56 is in the logic "low" state, the output of inverter 58 changes to the logic "high" state and the NMOS transistor 64 within the level shifter 40 is turned on. As a result, the PMOS transistor 62 is turned on, and the NMOS transistor 66 is turned off. The level shift signal LTS output from the output node of the level shifter 40 is output at the boosting voltage Vpp.

The PMOS transistor 52, the gate of which is connected to the level shift signal LTS, is turned off. The level shift signal LTS goes to the logic "high" level, and the boosting circuit 44 as shown in FIG. 4 is triggered.

Figure 4:
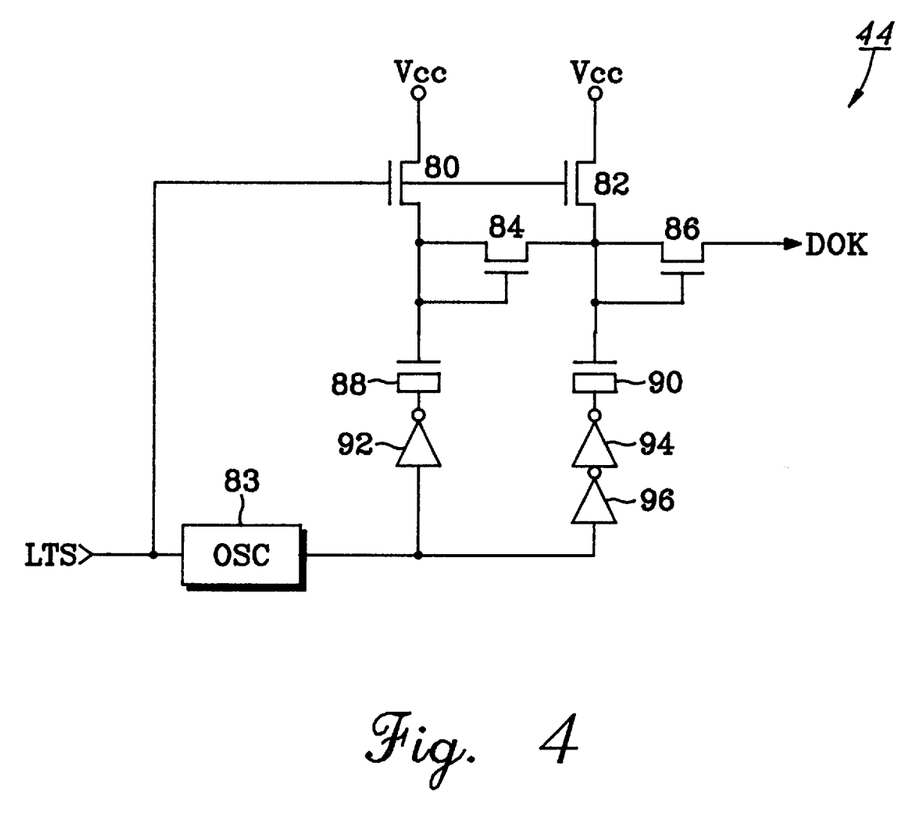
FIG. 4 is a circuit diagram of a boosting circuit of FIG. 3.

Referring now to FIG. 4, the boosting circuit 44 is a pumping circuit comprised of an oscillator 83, NMOS transistors 80, 82, 84 and 86, MOS capacitors 88 and 90 and inverters 92, 94 and 96. In the boosting circuit 44, when the level shift signal LTS output from the level shifter 40 goes to the logic "high" level, the NMOS transistors 80 and 82 are turned on, and one electrode of the MOS capacitors 88 and 90 are precharged to the power supply voltage Vcc level. The oscillator 83 oscillates LTS at a predetermined period, and supplies the oscillated signal to the input nodes of the inverters 92 and 96, respectively.

When the output of the oscillator 83 is in a logic "low" state, a precharge voltage on a drain node of the NMOS transistor 84 is boosted and transmitted to the source of NMOS transistor 84. When the output of the oscillator 83 is in a logic "high" state, a voltage on a gate node of the NMOS transistor 86 is boosted to about double voltage (2Vcc−Vtn) of the power supply voltage. The boosted voltage on the drain node of the NMOS transistor 86 is transmitted to the gate node DOK of the pull-up transistor 18.

Referring again to FIG. 3, when the voltage of the gate node DOK of the pull-up transistor 18 is boosted over the power supply voltage Vcc, i.e., to the second voltage level, the voltage Vgs between the gate-source of the pull-up transistor 18 is greater than the first level of the pull-up control voltage. Accordingly, when the data is accessed from the memory cell at relatively low speed and the logic level transition speed on the first data line DB exceeds the predetermined delay time in the inverter chain 54 within the delay detector 38, the voltage Vgs between the gate-source of the pull-up transistor 18 is raised, and the voltage level output from the source of the pull-up transistor 18 approaches the power supply voltage Vcc within a time period t2 in FIG. 5, to produce data output levels for the DC condition.

When the data on the first data line DB goes to the logic "low" level in the state where the power supply voltage Vcc level of data is output, the level shift control signal LTS from the level shifter 40 goes to a logic "low" level, and the driving of the boosting circuit 44 is stopped. As a result, the gate node DOK level of the pull-up transistor 18 is discharged to the reference voltage Vss level through the drain-source of the NMOS transistor 50. Thus, the data output buffer outputs logic data "1" having an output level of about 2.0 volts or more when the data from the memory cell is output at a "high" speed, and conversely, outputs the logic data "1" having an output level of about 2.4 volts or more when the data from the memory cell is output at a "low" speed.

Figure 6:
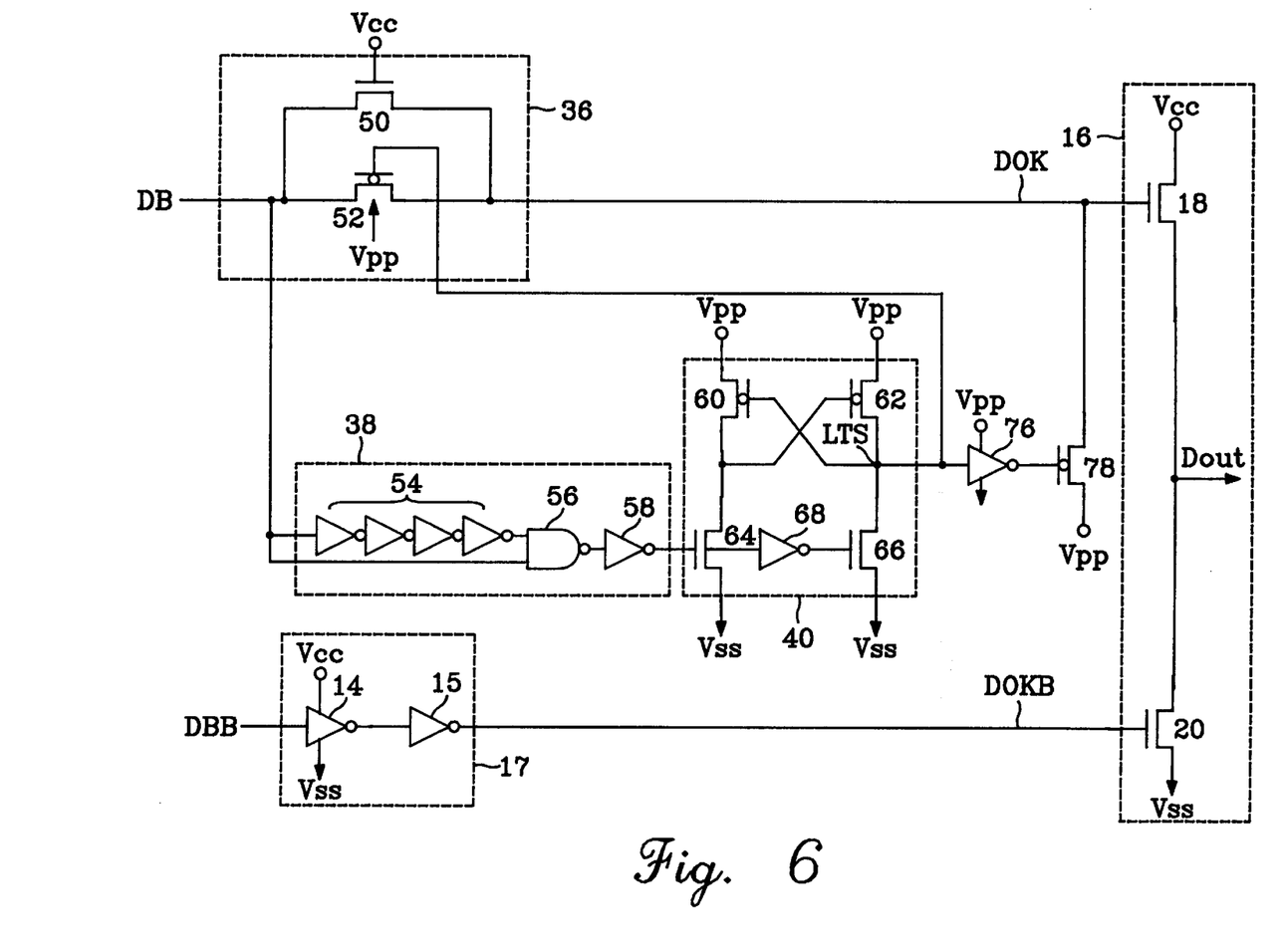
FIG. 6 is a circuit diagram of a data output buffer according to a second embodiment of the present invention.

FIG. 6 is a circuit diagram illustrating a data output buffer according to a second embodiment of the present invention. As shown, the boosting circuit 44 of FIG. 3 is not provided, but a PMOS transistor 78 and an inverter 76 are instead provided. The source of PMOS transistor 78 is coupled to the boosting voltage Vpp output from the boosting circuit within the chip, and the drain thereof is coupled to the gate node DOK of the pull-up transistor 18. The inverter 76 transmits the level-shifted signal from the output node of the level shifter 40 to the PMOS transistor 78. It should be noted that the inverter 76 inputs the boosting voltage Vpp output from the boosting circuit as an operating voltage. Thus, the inverter 76 utilizes the boosting voltage Vpp, having a voltage level over the power supply voltage Vcc level, in the standby state where the data from the memory cells is not accessed. The operation of FIG. 6 is the substantially same as that of FIG. 3, but instead of the boosting circuit of FIG. 4, the inverter 76 and the PMOS transistor 78 are used.

Data output buffers according to the present invention drive the data output driver 16 to the first level of a pull-up control signal, for example, to the power supply voltage Vcc, to thereby satisfy the data output level to the alternating current (AC) condition, for example where data from the memory cell is accessed at a high speed. On the other hand, the data output buffers drive the data output driver 16 to the boosting voltage higher than the first level of the pull-up control signal, to thereby satisfy the data output level of the direct current (DC) condition, for example where the data from the memory cell is accessed at a low speed. Accordingly, the present invention adaptively controls a data output level in accordance with a high speed output and a low speed output to reduce power consumption and to prevent malfunction due to a power noise in a semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit output buffer comprising:

a driver circuit which is responsive to an input logic signal at a first input logic value, to drive an output terminal to a first output logic value, and which is responsive to said input logic signal at a second logic value which is logically complementary to said first input logic value, to drive said output terminal to a second output logic value, at a first voltage level, said second output logic value being logically complementary to said first output logic value; and said driver circuit being further responsive to said input logic signal being at said second input logic value for at least a predetermined time to drive said output terminal to said second logic value at a second voltage level which is of greater magnitude than said first voltage level;

wherein said driver circuit comprises a delay detecting circuit which is responsive to said input logic signal being at said second input logic value for said predetermined time, to generate a boosting control signal.

2. An integrated circuit output buffer according to claim 1 wherein said driver circuit further comprises:

a level shifting circuit, responsive to said delay detecting circuit, to shift the level of the boosting control signal.

3. An integrated circuit output buffer according to claim 2 wherein said driver circuit further comprises:

a boosting circuit, responsive to said level shifting circuit, to provide a boosted voltage signal for said integrated circuit output buffer.

4. An integrated circuit output buffer comprising:

a driver circuit which is responsive to an input logic signal at a first input logic value, to drive an output terminal to a first output logic value, and which is responsive to said input logic signal at a second logic value which is logically complementary to said first input logic value, to drive said output terminal to a second output logic value, at a first voltage level, said second output logic value being logically complementary to said first output logic value; and a time dependent driver boosting circuit, which is responsive to said input logic signal being at said second input logic value for a predetermined time, to boost the driver circuit to drive said output terminal to said second logic value at a second voltage level which is of greater magnitude than said first voltage level;

wherein said driver circuit comprises a pull-up circuit which pulls up the said output terminal to said second logic value in response to a pull-up control signal which is applied thereto;

and wherein said time dependent driver boosting circuit comprises a pull-up control circuit which produces said pull-up control signal at a first control signal level in response to said input logic signal being at said second input logic value for less than said predetermined time, and which produces said pull-up control signal at a second control signal level which is of greater magnitude than said first control signal level, in response to said input logic signal being at said second input logic value for said predetermined time.

5. An integrated circuit output buffer according to claim 4 further comprising:

a pull-down circuit which pulls down said output terminal to said first logic value; and a pull-down control circuit, which produces a pull-down control signal in response to said input logic signal being at said first input logic value, said pull-down control signal being applied to said pull-down circuit.

6. An integrated circuit output buffer according to claim 5:

wherein said pull-up circuit comprises a pull-up transistor having a controlling electrode and a pair of controlled electrodes, the controlled electrodes being connected between a first reference voltage and said output terminal, wherein the pull-up signal is provided to said controlling electrode;

wherein said pull-down circuit comprises a pull-down transistor having a controlling electrode and a pair of controlled electrodes, the controlled electrodes being connected between a second reference voltage and said output terminal, and wherein the pull-down signal is provided to said controlling electrode.

7. An integrated circuit output buffer according to claim 6 wherein said pull-up control circuit comprises:

a driver which is responsive to said input logic signal being at said second input logic value, to generate said pull-up control signal at said first pull-up control signal level;

a delay detector which detects that said second input logic value has been maintained for said predetermined time; and a booster, responsive to said delay detector, which generates said pull-up control signal at said second pull-up control signal level, in response to said second input logic value having been maintained for said predetermined time.

8. An integrated circuit output buffer according to claim 7 wherein said pull-up circuit further comprises:

a level shifter, connected between said delay detector and said booster, and connected to said driver, for generating a level shift signal in response to said second input logic value being maintained for said predetermined time, said booster being responsive to said level shift signal to generate said pull-up control signal at said second pull-up control signal level, said driver being responsive to said level shift signal to deactivate said pull-up control signal at said first pull-up control signal level.

9. An integrated circuit output buffer according to claim 8 wherein said first pull-up control signal level is equal to said first reference voltage, and wherein said first voltage level is less than said first reference voltage in magnitude; wherein said second pull-up control signal level is greater in magnitude than said first reference voltage, and wherein said second voltage level is equal to said first reference voltage.

10. An output buffering method for an integrated circuit, comprising the steps of:

driving an output terminal to a first output logic value in response to an input logic signal being at a first input logic value;

driving said output terminal to a second output logic value, at a first voltage level, said second output logic value being logically complementary to said first output logic value, in response to said input logic signal being at a second logic value which is logically complementary to said first input logic value;

detecting that said input logic signal is at said second input logic value for a predetermined time; and driving said output terminal to said second logic value at a second voltage level which is of greater magnitude than said first voltage level, in response to said input logic signal being at said second input logic value for said predetermined time.

11. An integrated circuit output buffer comprising:

a driver circuit which is responsive to an input logic signal having an input logic signal speed, to produce first and second output voltages corresponding to first and second output logic values at an output terminal thereof, in response to said input logic signal having a first input logic signal frequency, and to produce said first output voltage and a third output voltage corresponding to said first and second output logic values at said output terminal, in response to said input logic signal having a second input logic signal frequency which is lower than said first input logic signal frequency, wherein said third voltage is of greater magnitude than said first voltage.

12. An output buffering method for an integrated circuit, comprising the steps of:

producing first and second output voltages corresponding to first and second output logic values, in response to an input logic signal having a first input logic signal frequency; and producing said first output voltage and a third output voltage corresponding to said first and second output logic values, in response to said input logic signal having a second input logic signal frequency which is lower than said first input logic signal frequency, wherein said third voltage is of greater magnitude than said first voltage.

13. An integrated output buffer comprising:

an output driver comprising an n-channel pull-up transistor, the drain of which is connected to a power supply voltage and the source of which is connected to a data output node, and an n-channel pull-down transistor, the drain of which is connected to said data output node and the source of which is connected to a reference voltage;

a pair of first and second data input lines;

a first pull-up control signal generator which pulls up the gate voltage of said n-channel pull-up transistor from the reference voltage to the power supply voltage in response to transition of data on said first data input line from a first logic level to a second logic level, and which cuts off said power supply voltage in response to a level shift signal;

a delay detector which detects a predetermined duration of said second logic level on said first data input line, and which generates a level shift control signal in response to said second logic level of said predetermined duration;

a level shifter which generates said level shift signal at a second power supply voltage level which is of a greater magnitude than said power supply voltage, in response to said level shift control signal;

a second pull-up control signal generator which boosts said power supply voltage in response to the level shift signal and which supplies said pull-up control signal having the second logic level to said data output driver; and a pull-down control signal generator which supplies a pull-down control signal at said reference voltage to the gate of said n-channel pull-down transistor in response to the first logic level of said second data line.

14. An integrated circuit output buffer according to claim 13, wherein said first pull-up control signal generator is a p-channel transistor connected between the gate of said pull-up transistor and said first data line, which supplies a signal having said second logic level from the first data line to the gate node of said pull-up transistor, and for cutting off in response to said level shift signal.

15. An integrated circuit output buffer according to claim 13, wherein said delay detector comprises:

a delayer which delays by said predetermined time period, the signal on said first data line;

a level shift control signal generator which compares an output of said delayer with the signal on said first data line and which generates said level shift control signal when the two compared signals have the second logic level;

a level shifter which generates the level shift signal of the second power supply voltage level of greater magnitude than said power supply voltage in response to said level shift control signal; and a booster which boosts said power supply voltage in response to the level shift signal and which supplies said pull-up control signal at the second logic level to the gate of said pull-up transistor.

16. An integrated output buffer comprising:

an output driver comprising an n-channel pull-up transistor, the drain of which is connected to a power supply voltage and the source of which is connected to a data output node; and an n-channel pull-down transistor, the drain of which is connected to said data output node and the source of which is connected to a reference voltage;

a pair of first and second data input lines;

a first pull-up control signal generator which pulls up the gate voltage of said n-channel pull-up transistor from the reference voltage to the power supply voltage in response to transition of data on said first data input line from a first logic level to a second logic level, and which cuts off said power supply voltage in response to a level shift signal;

a delay detector which detects a predetermined duration of said second logic level on said first data input line, and which generates a level shift control signal in response to said second logic level of said predetermined duration;

a level shifter which generates said level shift signal at a second power supply voltage level which is of a greater magnitude than said power supply voltage, in response to said level shift control signal;

a p-channel transistor, the source of which is connected to the second power supply voltage and the drain of which is connected to the gate node of said n-channel pull-up transistor, to supply said second power supply voltage to the gate node of said pull-up transistor in response to said level shift signal; and a pull-down control signal generator which supplies a pull-down control signal at said reference voltage to the gate of said n-channel pull-down transistor in response to the first logic level of said second data line.

17. An integrated circuit output buffer according to claim 16, further comprising an inverter between said level shifter and the gate of said PMOS transistor.

* * * * *